United States Patent
Kim et al.

(10) Patent No.: US 11,163,483 B2
(45) Date of Patent: Nov. 2, 2021

(54) ROBUST DETECTION TECHNIQUES FOR UPDATING READ VOLTAGES OF MEMORY DEVICES

(71) Applicant: SK hynix Inc., Icheon-si (KR)

(72) Inventors: Yongjune Kim, San Jose, CA (US); Kyungjin Kim, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 59 days.

(21) Appl. No.: 16/707,381

(22) Filed: Dec. 9, 2019

(65) Prior Publication Data

US 2020/0210096 A1 Jul. 2, 2020

Related U.S. Application Data

(60) Provisional application No. 62/787,168, filed on Dec. 31, 2018.

(51) Int. Cl.
*G06F 3/06* (2006.01)
*G11C 16/12* (2006.01)
(Continued)

(52) U.S. Cl.
CPC ............ *G06F 3/0653* (2013.01); *G06F 3/061* (2013.01); *G06F 3/064* (2013.01); *G06F 3/0616* (2013.01);
(Continued)

(58) Field of Classification Search
CPC ...... G06F 3/0653; G06F 3/064; G06F 3/0659; G06F 3/061; G06F 3/0679; G06F 17/16; G06F 3/0616; G11C 16/12; G11C 16/349; G11C 16/26; G11C 2211/5621; G11C 2211/5641; G11C 11/5628; G11C 11/5635; G11C 11/5642; G11C 16/3459;
(Continued)

(56) References Cited

U.S. PATENT DOCUMENTS 9,111,626 B2   8/2015   Kim et al.
9,552,887 B2   1/2017   Kim et al.
(Continued)

OTHER PUBLICATIONS

Y. Cai et al., "Program interference in MLC NAND flash memory: Characterization, modeling, and mitigation," 2013 IEEE 31st International Conference on Computer Design (ICCD), Asheville, NC, USA, 2013, pp. 123-130, doi: 10.1109/ICCD.2013.6657034 (Year: 2013).*

*Primary Examiner* — Jerome LeBoeuf
(74) *Attorney, Agent, or Firm* — Perkins Coie LLP

(57) ABSTRACT

Disclosed are devices, systems and methods for improving the reliability of retrieving information from a memory device. An exemplary method includes obtaining a plurality of cell counts for each of a plurality of read voltages applied to the memory device, each of the plurality of cell counts representing a number of cells having a cell voltage value that is within a voltage band corresponding to the read voltage applied thereto, generating, based on the plurality of cell counts, the plurality of read voltages and a design parameter, a set of estimated parameters, the design parameter being based on one or more properties of the memory device, determining an updated read voltage based on the estimated set of parameters, and applying the updated read voltage to the memory device to retrieve the information from the memory device.

20 Claims, 14 Drawing Sheets

(51) Int. Cl.
*G06F 17/16* (2006.01)
*G11C 16/34* (2006.01)
*G11C 16/26* (2006.01)

(52) U.S. Cl.
CPC .......... *G06F 3/0659* (2013.01); *G06F 3/0679* (2013.01); *G06F 17/16* (2013.01); *G11C 16/12* (2013.01); *G11C 16/26* (2013.01); *G11C 16/349* (2013.01)

(58) Field of Classification Search
CPC ..... G11C 16/10; G11C 16/16; G11C 16/3418; G11C 16/0483
See application file for complete search history.

(56) References Cited

U.S. PATENT DOCUMENTS

| | | | |
|---|---|---|---|
| 9,892,799 B1 | 2/2018 | Lin et al. | |
| 2009/0066641 A1* | 3/2009 | Mahajan | A63F 13/10 345/156 |
| 2013/0151753 A1* | 6/2013 | Jeon | G11C 11/5642 711/103 |
| 2018/0174024 A1* | 6/2018 | Lin | G06N 3/063 |

* cited by examiner

ROBUST DETECTION TECHNIQUES FOR UPDATING READ VOLTAGES OF MEMORY DEVICES

CROSS-REFERENCE TO RELATED APPLICATION

This patent document claims priority to and benefits of U.S. Provisional Patent Application No. 62/787,168 entitled "ROBUST DETECTION TECHNIQUES FOR MEMORY DEVICES" and filed on Dec. 31, 2018. The entire content of the before-mentioned patent application is incorporated by reference as part of the disclosure of this patent document.

TECHNICAL FIELD

This patent document generally relates to non-volatile memory devices, and more specifically, to robust and reliable access in non-volatile memory devices.

BACKGROUND

Data integrity is important for data storage devices and data transmission. In solid state memory storage (such as NAND flash) devices, information is stored in a cell by different charge levels in a cell. During the write and read process, noise is introduced by program disturb and inter-cell interference charge leakage that causes the voltage level to drop over time, where the drop is proportional to the amount of charge stored as well as the number of program and erase (P/E) cycles a cell has experienced. Accounting for the voltage drop when determining the read voltage thresholds increases the longevity of memory storage devices.

SUMMARY

Embodiments of the disclosed technology relate to methods, devices and systems that improve performance of a block of a memory device. In an example, the performance of the memory device is improved by generating read thresholds that account for the degradation of the memory cells, thereby enabling the robust retrieval of information from various types of memory devices over the entire lifespan.

In an example aspect, a method for improving the reliability of retrieving information from a memory device includes obtaining a plurality of cell counts for each of a plurality of read voltages applied to the memory device, each of the plurality of cell counts representing a number of cells having a cell voltage value that is within a voltage band corresponding to the read voltage applied thereto; generating, based on (i) the plurality of cell counts, (ii) the plurality of read voltages and (iii) a design parameter, a set of estimated parameters, the design parameter being based on one or more properties of the memory device and selected to reduce a variance of at least one parameter of the set of estimated parameters; determining an updated read voltage based on the estimated set of parameters; and applying the updated read voltage to the memory device to retrieve the information from the memory device, wherein the plurality of cell counts comprises N cell counts, wherein the set of estimated parameters comprises M estimated parameters, wherein N and M are positive integers, and wherein N is greater than (M+1).

In another example aspect, a method for improving the reliability of retrieving information from a memory device includes obtaining a plurality of cell counts for each of a plurality of read voltages applied to the memory device, each of the plurality of cell counts representing a number of cells having a cell voltage value that is within a voltage band corresponding to the read voltage applied thereto; generating, based on the plurality of cell counts and the plurality of read voltages, a set of estimated parameters, the generating further based on a regularized least squares, wherein a non-negative regularization parameter of the regularized least squares is based on one or more properties of the memory device and is selected to reduce a variance of at least one of the set of estimated parameters, the one or more properties comprising a number of program/erase (PE) cycles or a retention parameter; determining an updated read voltage based on the estimated set of parameters; and applying the updated read voltage to the memory device to retrieve the information from the memory device.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Figure 1:
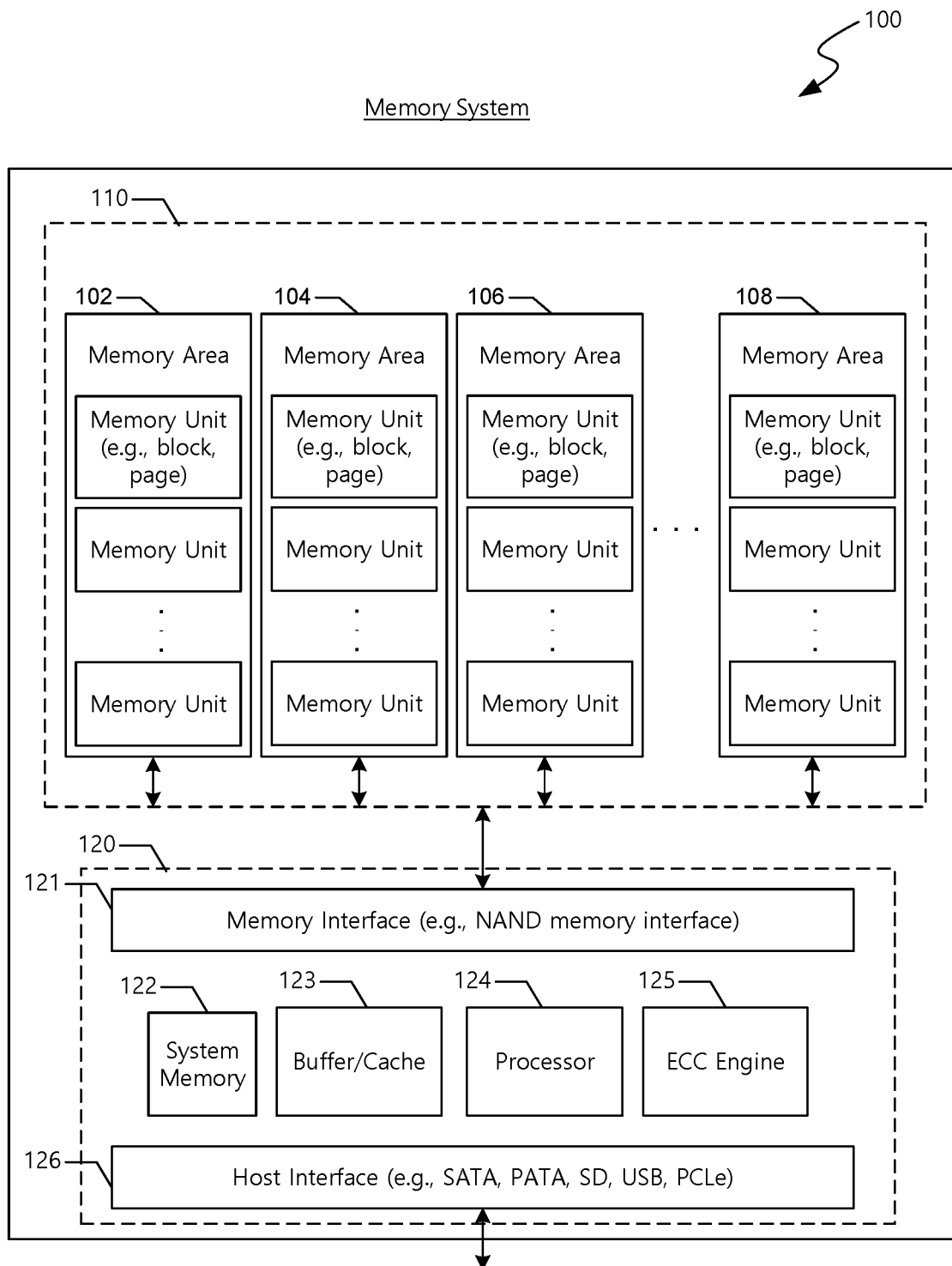
FIG. 1 illustrates an example of a memory system.

Semiconductor memory devices may be volatile or non-volatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC memory device must have threshold voltages corresponding to four or more discriminable data states in a limited voltage window. For improvement of the data integrity, levels of read voltages for discriminating the data states must be adjusted over the lifetime of the memory device to have optimal values.

In solid state memory storage (such as NAND Flash) devices, information is stored in a cell by different charge levels in a cell. During write and read process, noise is introduced by program disturb and inter-cell interference charge leakage that causes the voltage level to drop over time, where the drop is proportional to the amount of charge stored as well as the number of program and erase (P/E) cycles a cell has experienced. Since the noise varies across cells, cells intended to be written to the same voltage level exhibit certain voltage distribution when read back. Usually, the distribution from a higher intended voltage level will drift down and broaden as time passes due to the charge leaking effect, potentially overlapping a part of the distribution from a lower intended voltage level. This drifting and broadening phenomenon is more severe for smaller fabrication process nodes. Consequently, discerning cells that belong to a particular distribution becomes increasingly difficult as NAND flash memory vendors aggressively shrink the fabrication process nodes to increase storage density and reduce cost.

For hard-read NAND flash memory storage devices, reading back the stored information involves comparing the cell voltage against a set of thresholds. In single-level cell (SLC) devices, the read back value of a bit (either 0 or 1) is solely based on whether the cell voltage is above or below a single threshold. (The term "hard-read" refers to the fact that the read back values are either 0 or 1. This is in contrast to the term "soft-read", where the read back values can take on a range of numbers for representing the cell voltage in a fine resolution.) Ideally, the thresholds should be chosen to minimize the number of bit errors due to two potentially overlapping distributions. However, this is not an easy task as the distributions, which are a function of the intended voltage levels, the number of P/E cycles the cells have gone through, and the data retention period (i.e., the period of time elapsed between writing and reading the data), are not known in advance.

FIG. 1 is a block diagram of an example of a memory system 100 that can be implemented in some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive or a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
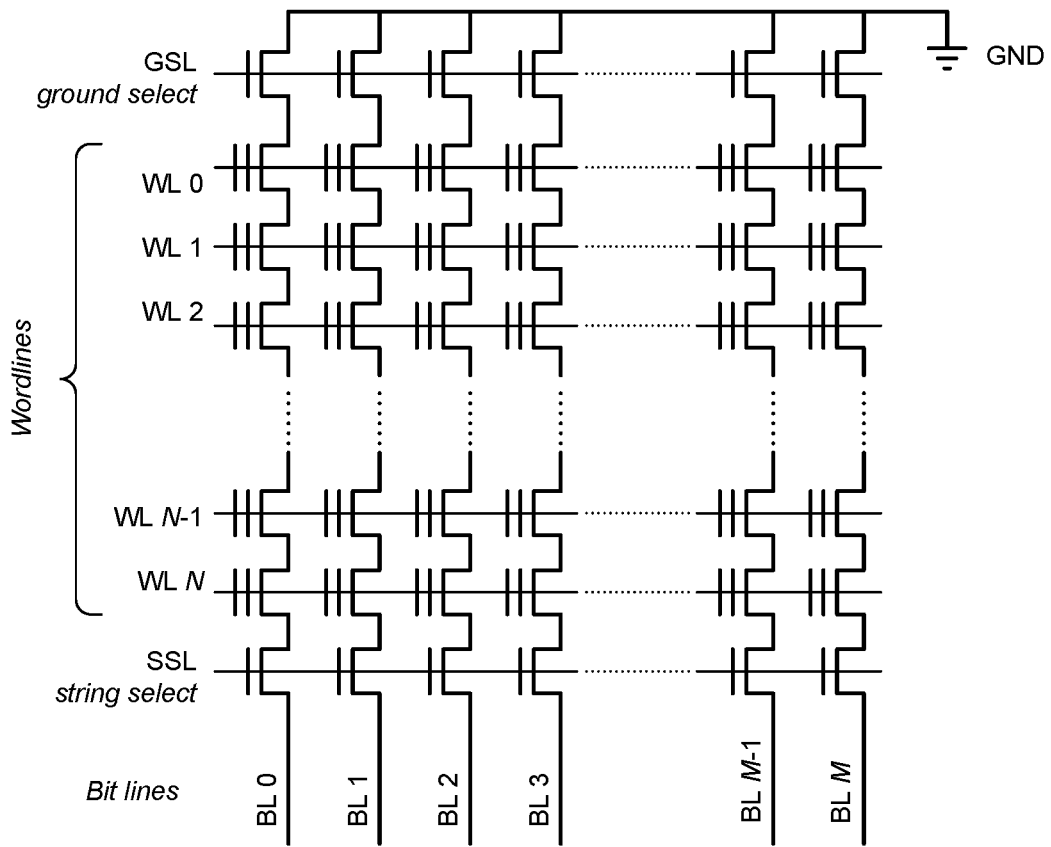
FIG. 2 is an illustration of an example non-volatile memory device.

FIG. 2 illustrates an example of a memory cell array that can be used in some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bitline structure. In another implementation, NAND flash memories may use an all-bitline structure. In the even/odd bitline structure, even and odd bitlines are interleaved along each wordline and are alternatively accessed so that each pair of even and odd bitlines can share peripheral circuits such as page buffers. In an all-bitline structure, all the bitlines are accessed at the same time.

Figure 3A:
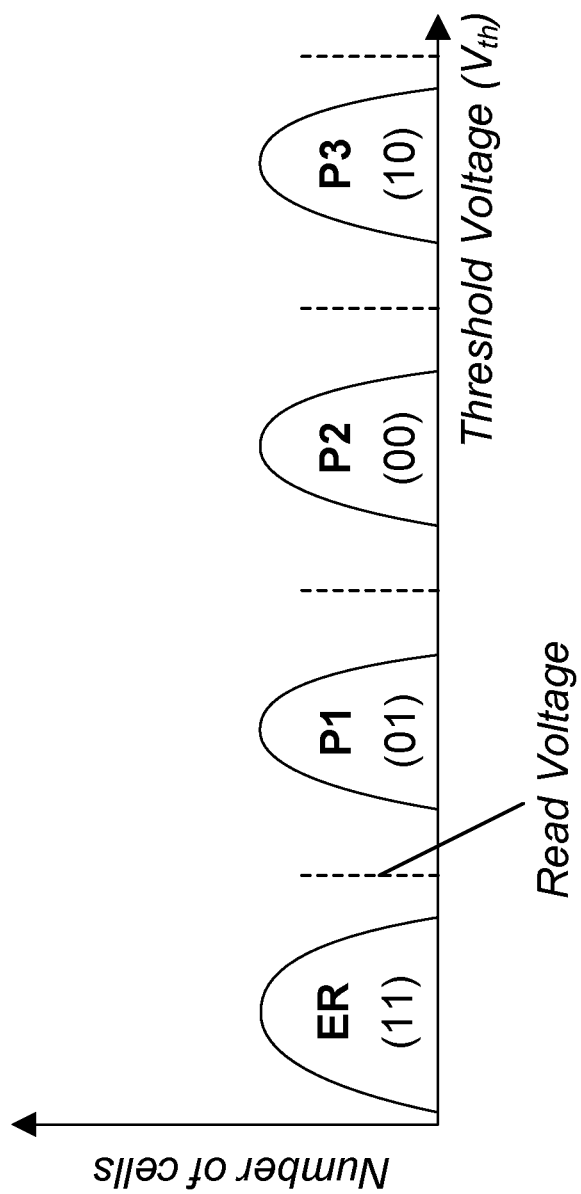
FIG. 3A is an example diagram illustrating the ideal cell voltage level distribution (Vth) of a non-volatile memory device.

FIG. 3A illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same wordline are repeatedly programmed using a program-and-verify approach with a stair case program voltage applied to wordlines. Each programmed state associates with a verify voltage that is used in verify operations and sets the target position of each threshold voltage distribution window.

Figure 3B:
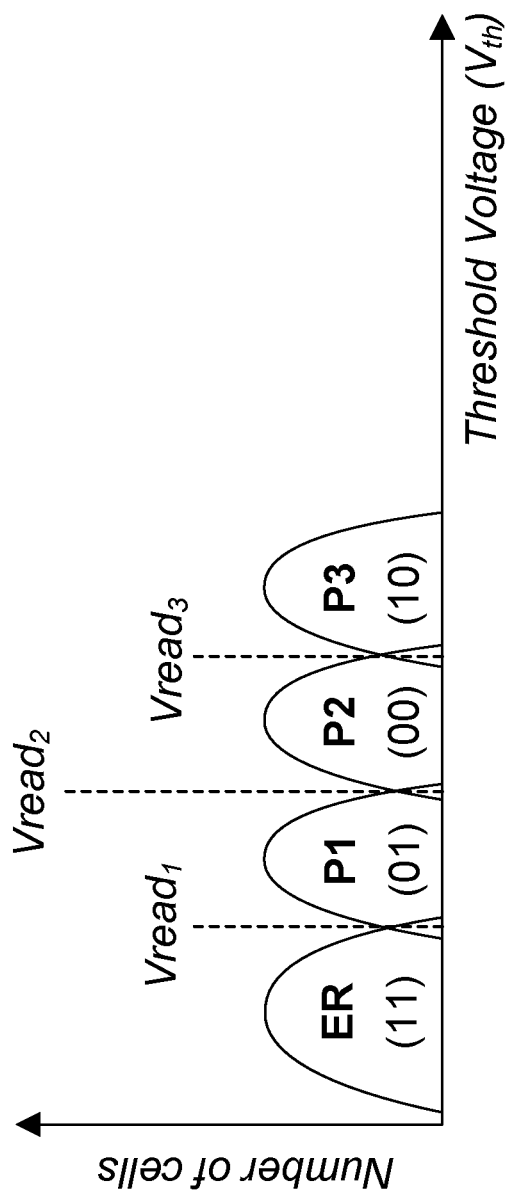
FIG. 3B is an example diagram illustrating the shifted cell voltage level distribution (Vth) of a non-volatile memory device.

Read errors can be caused by distorted or overlapped threshold voltage distribution (as illustrated, for example, in FIG. 3B). An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
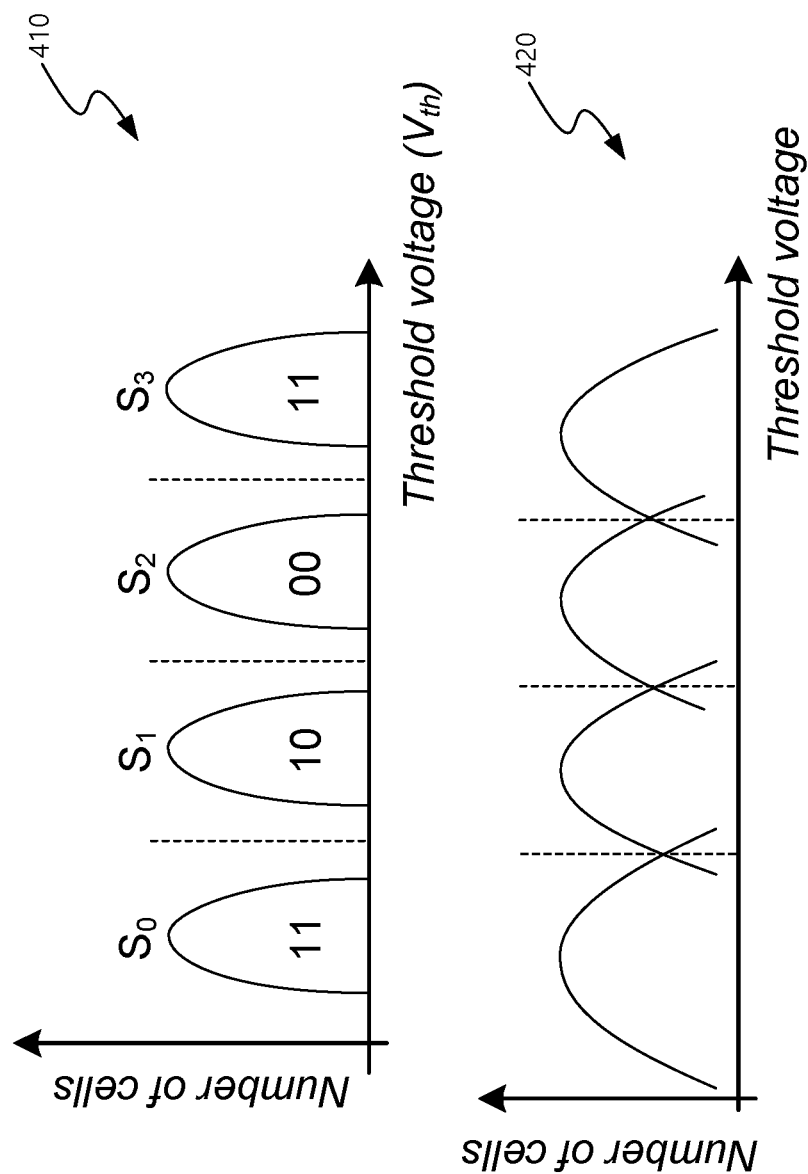
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to 2n possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
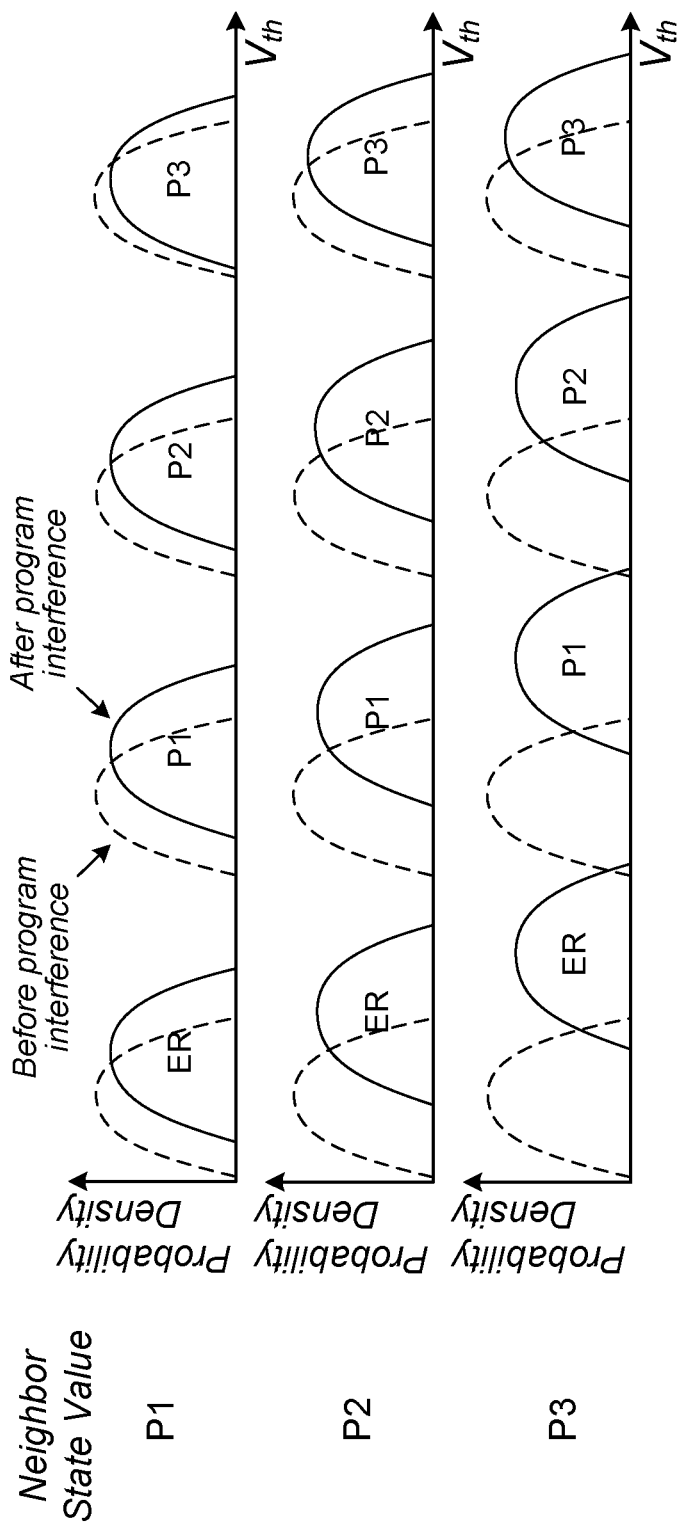
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bitline structure. In the even/odd bitline structure, memory cells on one wordline are alternatively connected to even and odd bitlines and even cells are programmed ahead of odd cells in the same wordline. Therefore, even cells and odd cells experience different amount of cell-to-cell interference. Cells in all-bitline structure suffer less cell-to-cell inference than even cells in the even/odd bitline structure, and the all-bitline structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
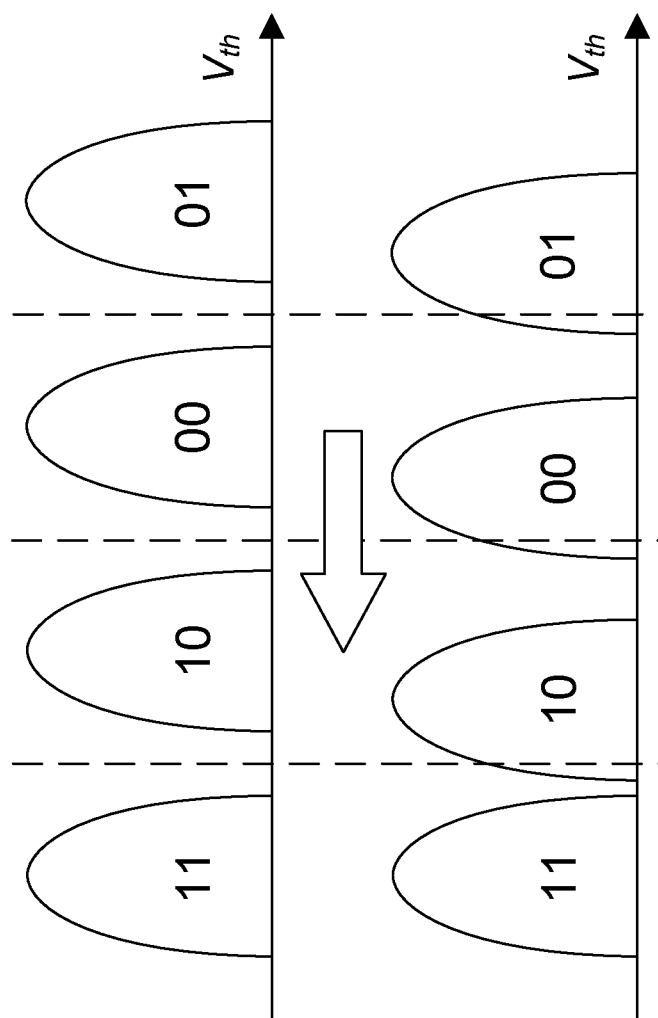
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

Embodiments of the disclosed technology provide techniques which improve the process by which a read threshold is determined and/or inputs which are used to determine a read threshold in the NAND flash memory described in FIGS. 1-6. Improving a read threshold would, for example, reduce the number of read errors and may enable some codewords (e.g., which are uncorrectable using an error correction code when a less optimal read threshold is used during the read process) to be decoded (e.g., because the reduced number of read errors now falls within the error correction capability of the code).

As described above, FIG. 3A illustrates an ideal distribution of different program and erase states of a 2-bit MLC memory device as function of threshold voltage. As illustrated therein, the number of cells per state is shown as a function of the threshold voltage ($V_{threshold}$). In an MLC memory device (e.g., an MLC flash memory device capable of storing k-bit data in a single memory cell) the memory cell may have one of $2^k$ threshold voltage distributions. For example, the 2-bit MLC has one of four threshold voltage distributions.

Threshold voltages of memory cells programmed for the same data form the threshold voltage distribution due to characteristic differences between memory cells. In the 2-bit MLC memory device, as illustrated in FIG. 3A, threshold voltage distributions are formed in correspondence with the data states including 3 program states 'P1', 'P2' and 'P3' and an erase state 'E'. FIG. 3A shows an ideal case in which threshold voltage distributions do not overlap and have sufficient read voltage margins between.

FIG. 3B illustrates a distribution of different program and erase states due to characteristic deterioration of the 2-bit MLC memory device, and as a function of the threshold voltage. As illustrated therein, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 3B, the threshold voltage distribution may be shifted due to charge loss.

Further, program disturbance, erase disturbance and/or back pattern dependency also cause increases in threshold voltages. As characteristics of memory cells deteriorate, neighboring threshold voltage distributions may overlap, as illustrated in FIG. 3B.

Once neighboring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighboring threshold voltage distributions overlap, a memory cell that has the third program state 'P3' may be erroneously determined to have the second program state 'P2'. Said another way, when the neighboring threshold voltage distributions overlap as illustrated in FIG. 3B, read data may include a number of errors. To assist with reducing the number of errors, threshold voltage for a memory device may be characterized using a polynomial interpolation technique.

Figure 7:
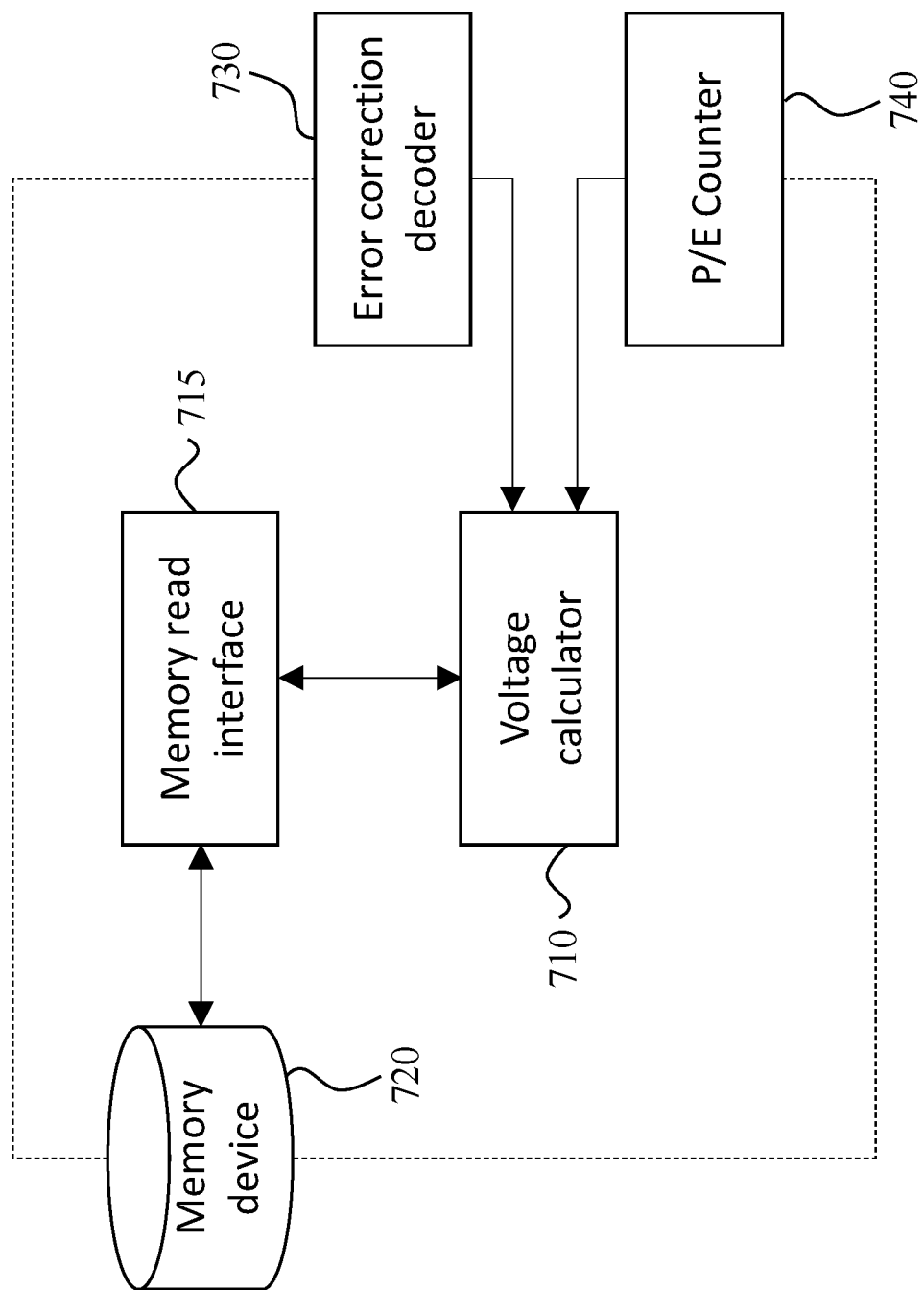
FIG. 7 is a block diagram illustrating an exemplary storage system configured to reliably read information.

FIG. 7 is a block diagram illustrating an exemplary storage system configured to reliably read information. It is to be noted that the diagram of FIG. 7 is simplified to illustrate only some of the components in the storage system, which may include additional components that are not shown. As illustrated in FIG. 7, data is stored on a memory device 720 (e.g., NAND Flash). A memory read interface 715 is used to access the data stored on the memory device 720 and takes as input a read threshold and read address(es) and returns the read data. In some embodiments, the voltage calculator 710 may calculate the optimal read voltage in accordance with the presently disclosed technology. The exemplary storage system 700 may further include an error correction decoder 730 and a program/erase (P/E) counter, which may be connected to the memory device 720. In some embodiments, some or all of the modules in FIG. 7 are implemented using semiconductor components, such as an application-specific integrated circuit (ASIC) or a field-programmable gate array (FPGA).

In some embodiments, the data that is read from the memory device 720 by the memory read interface 715 is passed to the error correction decoder 730, which is configured to determine whether the codewords read from the memory device 720 can be correctly decoded of not. In an example, if the codewords do not decode correctly, the voltage calculator 710 may be instructed to generate another read voltage. In some embodiments, the error correction decoder 730 includes a low-density parity check (LDPC) code or another systematic code with parity symbols (which may be either bits or non-binary symbols).

Figure 8:
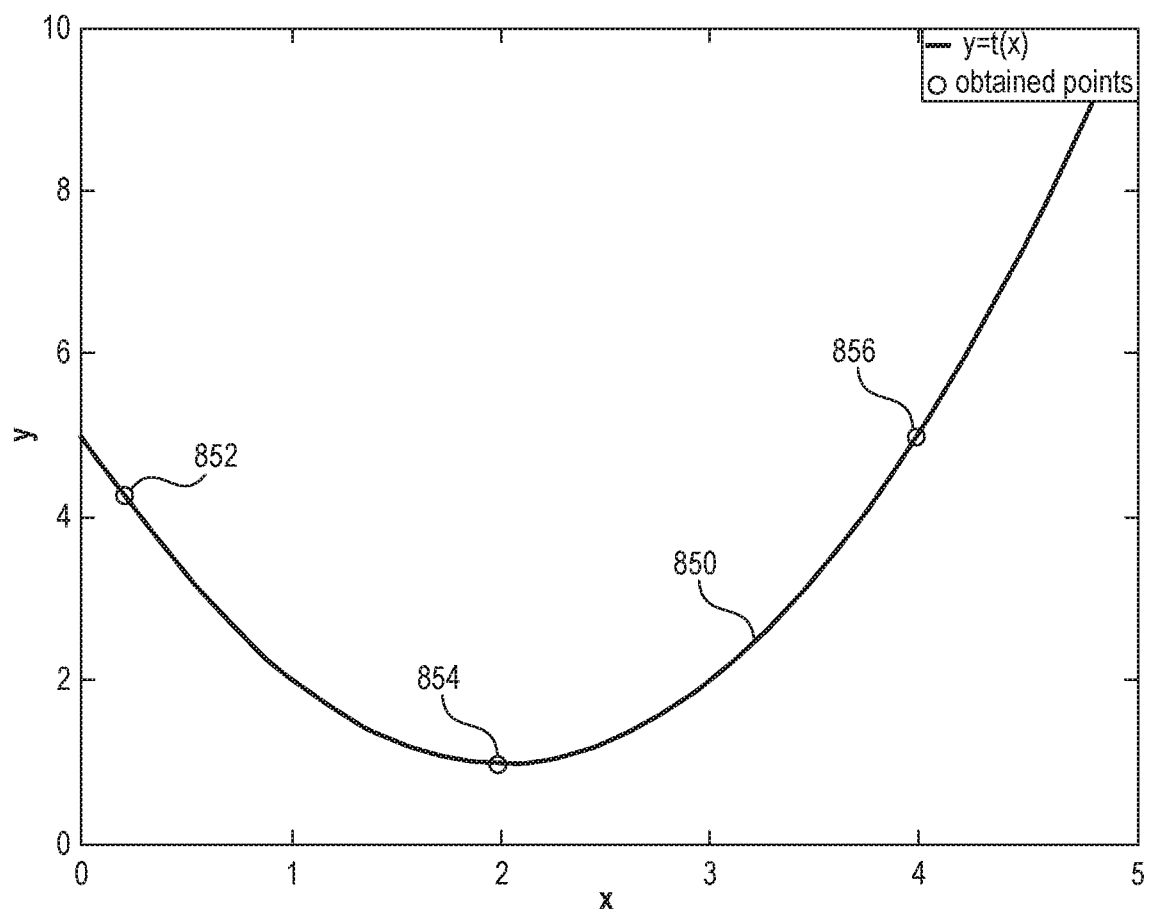
FIG. 8 illustrates an example of a polynomial interpolation for a quadratic function.

FIG. 8 illustrates an example of a polynomial interpolation for a quadratic function, $y=f(x)=\alpha_0+\alpha_1 x+\alpha_2 x^2$, where the threshold voltage distribution between two states $S_i$ and $S_{i+1}$ has been modeled by the parabola 850 illustrated therein. In this example illustrated in FIG. 8, $a=(\alpha_0, \alpha_1, \alpha_2)=(5, -4, 1)$. Polynomial interpolation has been used in existing implementations to determine an optimal read voltage in scenarios similar to those illustrated in FIG. 3B, where neighboring threshold voltage distributions have overlapped due to degradation of the cells of the memory device.

In the example illustrated in FIG. 8, the parameters ($\alpha_0$, $\alpha_1$, $\alpha_2$) are estimated by first obtaining three data points, e.g., ($x_1$, $y_1$) 852, ($x_2$, $y_2$) 854, and ($x_3$, $y_3$) 856, where $y_i$ represents the number (or probability density function) of cells and $x_i$ represents the i-th threshold voltage that is read, and then solving the equation:

$$\begin{bmatrix} y_0 \\ y_1 \\ y_2 \end{bmatrix} = \begin{bmatrix} 1 & x_0 & x_0^2 \\ 1 & x_1 & x_1^2 \\ 1 & x_2 & x_2^2 \end{bmatrix} \begin{bmatrix} a_0 \\ a_1 \\ a_2 \end{bmatrix}.$$

In general, for polynomial interpolations, if there are m parameters, then m+1 values (or pairs of measurements) are used to estimate the parameters. The above linear equation can be represented as:

y=Xa.

Herein, $$y = \begin{bmatrix} y_0 \\ y_1 \\ y_2 \end{bmatrix}, X = \begin{bmatrix} 1 & x_0 & x_0^2 \\ 1 & x_1 & x_1^2 \\ 1 & x_2 & x_2^2 \end{bmatrix} \text{ and } a = \begin{bmatrix} a_0 \\ a_1 \\ a_2 \end{bmatrix}.$$

Once the parameters ($\alpha_0$, $\alpha_1$, $\alpha_2$) have been estimated, the optimal read voltage level is determined as:

$$x_{opt} = -\frac{a_1}{2a_2}.$$

Herein, the optimal read voltage satisfies $$\frac{dy}{dx} = 0$$

where $y = \alpha_0 + \alpha_1 x + \alpha_2 x^2$.

Figure 9A:
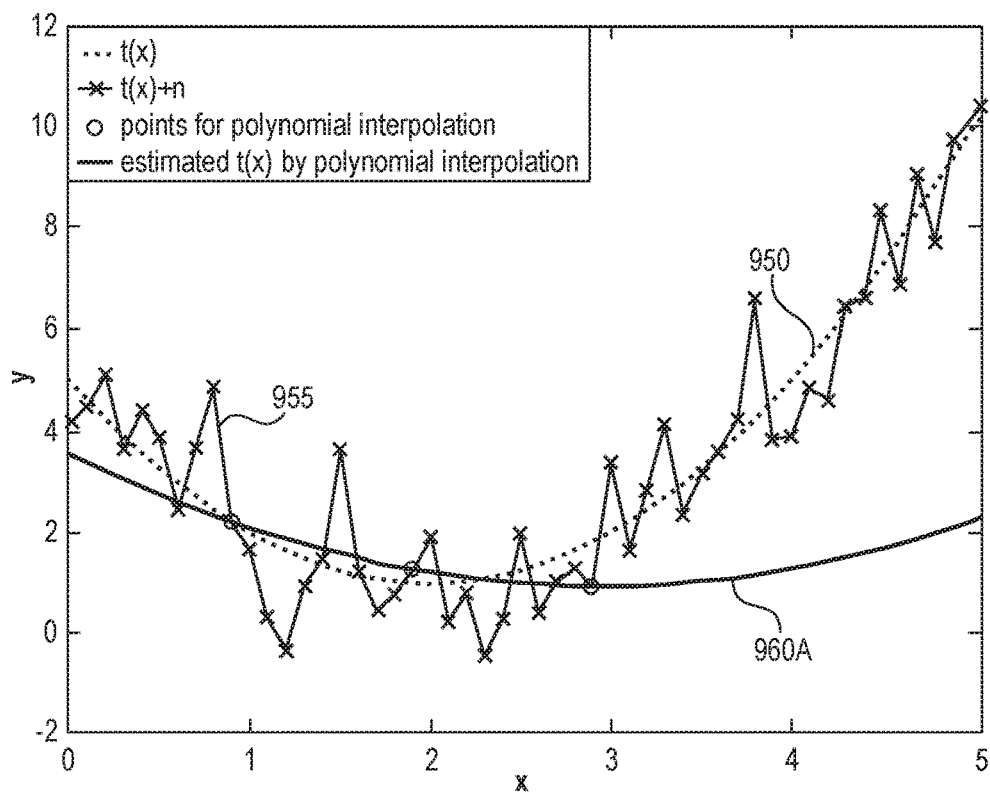
FIG. 9A illustrates an example of a polynomial interpolation of a noisy quadratic function.
Figure 9B:
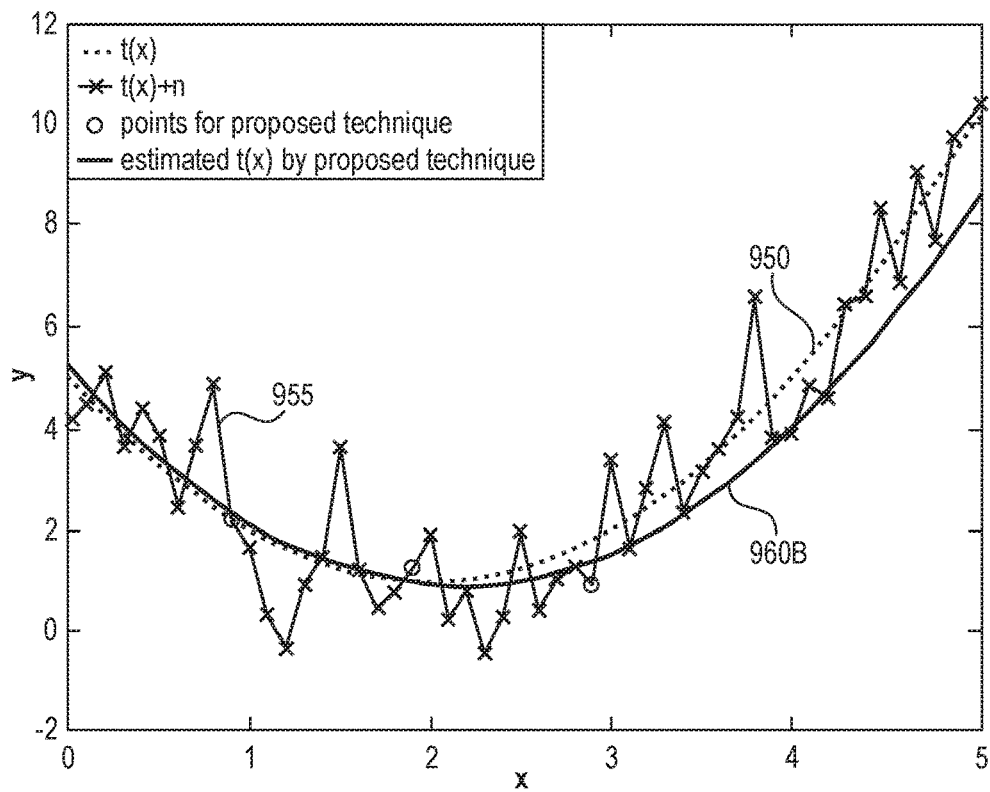
FIG. 9B illustrates an example of a least squares regression of a noisy quadratic function.

However, polynomial interpolation is not robust to noise, which is demonstrated using the example shown in FIGS. 9A and 9B, which illustrates a comparison of a polynomial interpolation and a least squares regression, respectively, of a noisy quadratic function. As illustrated therein, the original parabolic function 950 is perturbed by noise (e.g., additive white Gaussian noise (AWGN)) resulting in a noisy parabolic function 955. FIG. 9A illustrates the result 960A of the polynomial interpolation described above, which is clearly a poor fit to the original parabolic function 950.

Embodiments of the disclosed technology, among other features and benefits, improve the robustness of the parameter estimation to noise, and instead of using polynomial interpolation, are based on the least squares framework. In an example, the least squares method uses four points, and is represented as:

$$\begin{bmatrix} y_1 \\ y_2 \\ y_3 \\ y_4 \end{bmatrix} = \begin{bmatrix} 1 & x_0 & x_0^2 \\ 1 & x_1 & x_1^2 \\ 1 & x_2 & x_2^2 \\ 1 & x_3 & x_3^2 \end{bmatrix} \begin{bmatrix} a_0 \\ a_1 \\ a_2 \end{bmatrix}.$$

In some embodiments, the above equation can be expressed as $y = Xa$, and the parameters can be estimated as:

$$a = (X^T X)^{-1} X^T y.$$

Herein, the superscript T denotes the transpose operation.

FIG. 9B illustrates the result 960B of the least squares method described above, which is clearly a significantly better fit to the original parabolic function 950 than the result 960A of the polynomial interpolation. Table 1 provides a numerical comparison of the values determined using the polynomial interpolation and the least squares method to the actual values of the parameters and the optimal read voltage.

TABLE 1

Comparison of polynomial interpolation and the least squares method

|  | Original Value | Polynomial Interpolation | Least Squares |
|---|---|---|---|
| $a = (a_0, a_1, a_2)$ | (5, −4, 1) | (3.53, −1.75, 0.30) | (5.23, −4.07, 0.94) |
| $x_{opt}$ | 2 | 2.94 | 2.16 |

In general, and for a polynomial $f(x)$ whose degree is $\deg(f(x)) = m$, the least squares method can estimate the parameters a with N points (N > m+1) using $$a = (X^T X)^{-1} X^T y.$$

Herein, $$y = \begin{bmatrix} y_0 \\ \vdots \\ y_{n-1} \end{bmatrix} \text{ and } X = \begin{bmatrix} 1 & \cdots & x_0^m \\ \vdots & \ddots & \vdots \\ 1 & \cdots & x_{n-1}^m \end{bmatrix}.$$

Note that the least squares method uses at least m+2 points, whereas the polynomial interpolation uses m+1 points.

In some embodiments, and for improved stability, the parameters a may be estimated using a regularized least squares method, which is given by:

$$a = (X^T X + \lambda I)^{-1} X^T y.$$

Herein, I is an identity matrix and $\lambda$ is the regularization parameter or coefficient. In an example, the regularization parameter $\lambda$ is a small positive value, which reduces the variance of the estimates a. In some embodiments, the regularization parameter $\lambda$ can be chosen based on the memory device's status such as P/E cycles and retention. In an example, the P/E cycles and retention may be determined using the P/E counter 740 and error correction decoder 730, respectively, as illustrated in FIG. 7.

In other embodiments, the parameters a may be estimated using a modified regularized least squares method, which is given by:

$$a = (X^T X - \bar{\lambda} I)^{-1} X^T y.$$

Herein, $\bar{\lambda}$ is the regularization parameter or coefficient that is less than or equal to zero. That is, the regularization parameter $\bar{\lambda}$ is a small negative value, which reduces the variance of the estimates a.

In some embodiments, and instead of estimating the parameter a by the matrix operations, the parameter a can be calculated by an iterative way to reduce the computational complexity. In an example, the iterative algorithm used is shown in Table 2.

TABLE 2

Iterative algorithm for parameter estimation

Parameters: $\beta$ (step size)
Computation: For i = 0, 1, 2, ...
   1.    Obtain a point $(x_i, y_i)$ from flash memory
   2.    Set $x_i = \begin{bmatrix} 1 \\ \vdots \\ x_i^m \end{bmatrix}$
   3.    $e_i = y_i - x_i^T a_i$
   4.    $a_{i+1} = a_i + \beta e_i x_i$
Until stopping criterion is satisfied.

In some embodiments, the described least squares (LS) and regularized least squares (RLS) methods may need more data points to reduce the effect of noise. As discussed previously in the context of FIG. 8, the optimal read voltage is between two states $S_i$ and $S_{i+1}$, and then the candidate read voltage (and specifically, the first read voltage) must be between the two states. This preprocessing operation may include a number of read operations, one or more of which can be reused to reduce the effect of noise. In contrast to the existing implementation, based on polynomial interpolation, which does not use the read operations that are part of the preprocessing operation, embodiments of the disclosed technology can use all these initial read operations to reduce the variance of the estimated parameters.

Figure 10:
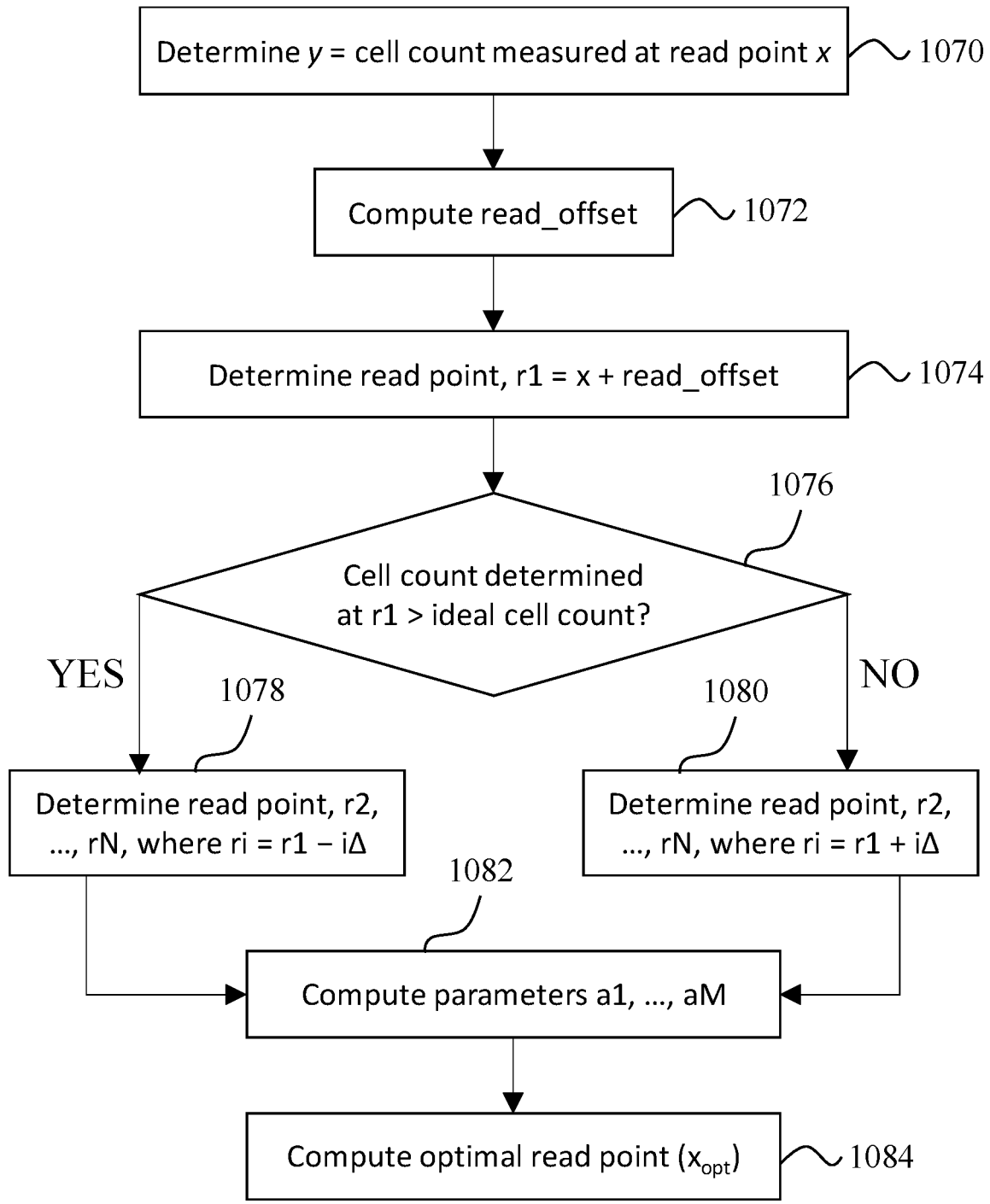
FIG. 10 illustrates a flowchart of a method for improving reliability of retrieving information from a memory device.

FIG. 10 is a flowchart illustrating an exemplary method for reliably reading information in a memory device. The method 1000 includes, at operation 1070, determining a cell count (y) measured at a read point (x). In order to find the optimal read point, the first read point ($r_1$) has to be within a valley region between two states, and the read_offset can be computed (at operation 1072) using the following proportionality expression:

read_offset=(width of a state)×(y−ideal_cell_count)/ ideal_cell_count.

Herein, the ideal_cell_count is the number of cells measured for a particular read voltage assuming no deterioration in the program and erase states of an MLC memory device (e.g., as illustrated in FIG. 3A). In some embodiments, the ideal_cell_count parameter may be stored in a lookup table. The method 1000 includes, at operation 1074, determining the first read point ($r_1$) as a sum of the original read point and the read_offset, ensuring that the first read point is within the valley region between the two states.

The method 1000 includes, at operation 767, comparing the cell count determined at the first read voltage point ($r_1$) to the ideal cell count. If the cell count measured at the first read point is greater than ideal cell count (at operation 1078), it continuously reads by subtracting a delta ($\Delta$) from the first read point until threshold$_1$. That is, the subsequent read points (r2, . . . , rN) are determined by consecutively subtracting $\Delta$ from the first read point r1 until a predetermined first threshold (threshold$_1$) is reached. Similarly, if the cell count measured at the first read point is less than ideal cell count (at operation 1080), the method continuously reads while adding a delta ($\Delta$) to the first read point until a second threshold (threshold$_2$). In an example, the read voltage step-size $\Delta$, threshold$_1$ and threshold$_2$ are parameters, which are defined experimentally.

The method 1000 includes, at operation 1082, computing the parameters ($\alpha_1, \alpha_2, \ldots, \alpha_M$) using the (x, y) value pairs from the N read points ($r_1, r_2, \ldots, r_N$), and then computing the optimal read point (at operation 1084). In some embodiments, the optimal read point may be offset by a predetermined offset value, which may be determined experimentally.

Figure 11:
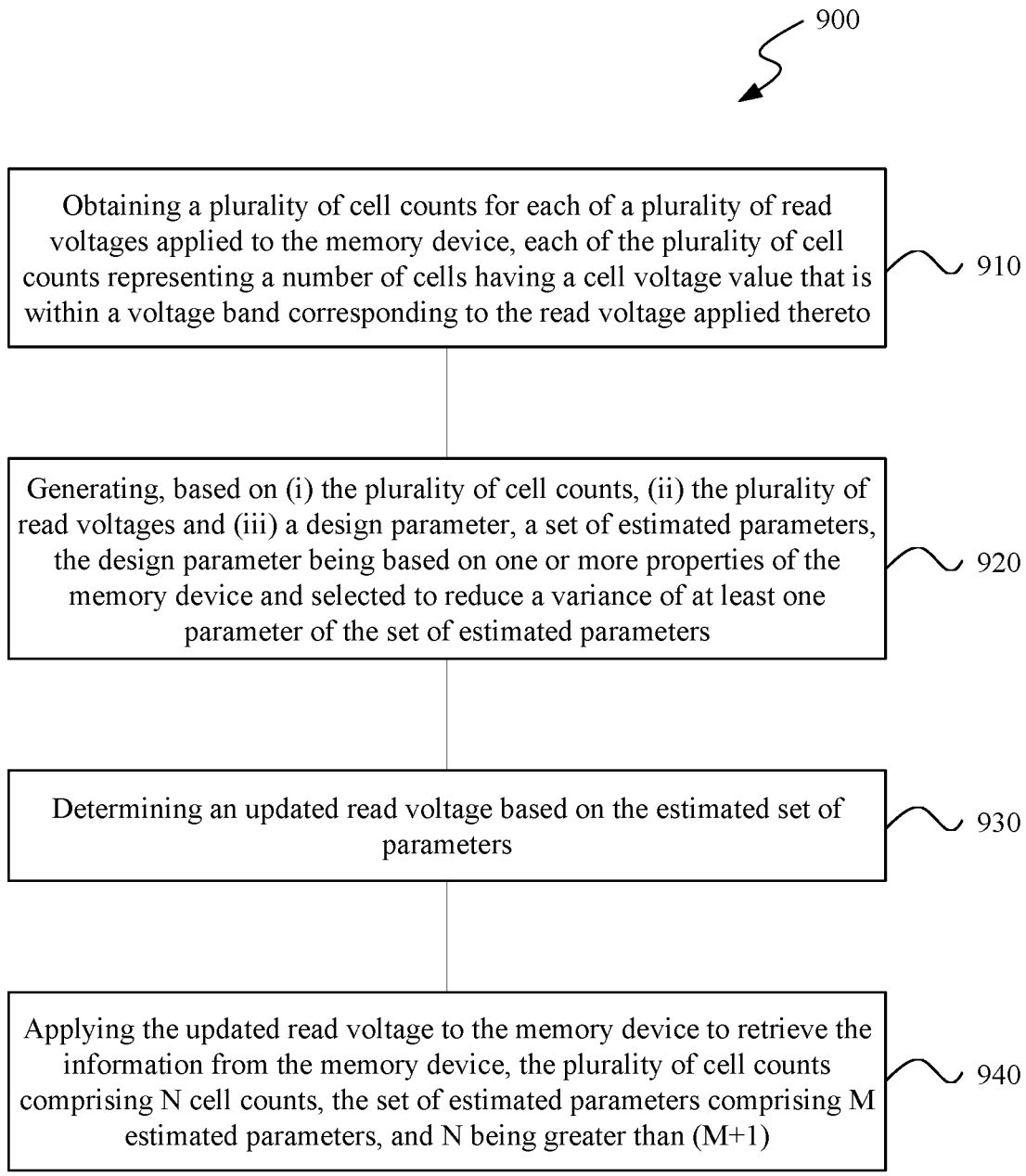
FIG. 11 illustrates a flowchart of another method for improving reliability of retrieving information from a memory device.

FIG. 11 is a flowchart illustrating another exemplary method for reliably reading information in a memory device. The method 1100 includes, at operation 1110, obtaining a plurality of cell counts for each of a plurality of read voltages applied to the memory device, each of the plurality of cell counts representing a number of cells having a cell voltage value that is within a voltage band corresponding to the read voltage applied thereto.

The method 1100 includes, at operation 1120, generating, based on (i) the plurality of cell counts, (ii) the plurality of read voltages and (iii) a design parameter, a set of estimated parameters, the design parameter being based on one or more properties of the memory device and selected to reduce a variance of at least one parameter of the set of estimated parameters.

The method 1100 includes, at operation 1130, determining an updated read voltage based on the estimated set of parameters.

The method 1100 includes, at operation 1140, applying the updated read voltage to the memory device to retrieve the information from the memory device, the plurality of cell counts comprising N cell counts, the set of estimated parameters comprising M estimated parameters, and N being greater than (M+1).

In some embodiments, the generating is based on a regularized least squares, and the design parameter is a non-negative regularization parameter.

In some embodiments, the plurality of cell counts is denoted ($y_0, y_1, \ldots, y_{N-1}$) and the plurality of read voltages is denoted ($x_0, x_1, \ldots, x_{N-1}$), the set of parameters is denoted ($\alpha_0, \alpha_1, \ldots, \alpha_{M-1}$), the non-negative regularization parameter is denoted $\lambda$, the estimated set of parameters $\tilde{\alpha}$ is given by $\tilde{\alpha}=(X^TX+\lambda I)^{-1}X^Ty$, I is an M×M identity matrix and T denotes a transpose operation, $\tilde{\alpha}=[\alpha_0, \alpha_1, \ldots, \alpha_{M-1}]^T$ and $y=[y_0, y_1, \ldots, y_{N-1}]^T$, $$X = \begin{bmatrix} 1 & x_0 & x_0^2 & \ldots & x_0^{M-1} \\ \vdots & \vdots & \vdots & \ddots & \vdots \\ 1 & x_{N-1} & x_{N-1}^2 & \ldots & x_{N-1}^{M-1} \end{bmatrix},$$

N=3, M=2, and the updated read voltage is given by $-\alpha_1/(2\alpha_2)$.

In some embodiments, the generating excludes a matrix inversion operation and is based on an iterative computation and a stopping criterion.

In some embodiments, a first of the plurality of read voltages ($x_0$) is greater than a first read voltage of a first state and less than a second read voltage of a second state, and the method 1100 further comprises the operation of comparing a first of the plurality of cell counts ($y_0$) to an ideal cell count.

In some embodiments, the method further comprises the operations of determining that $y_0$ is greater than the ideal cell count, and setting $x_i=x_0-i\Delta$ for i=1, . . . , N−1, wherein $\Delta$ is a predetermined parameter.

In some embodiments, the method further comprises the operations of determining that $y_0$ is less than the ideal cell count, and setting $x_i=x_0+i\Delta$ for i=1, . . . , N−1, wherein $\Delta$ is a predetermined parameter.

In some embodiments, the one or more properties of the memory device comprise a number of program/erase (PE) cycles or a retention parameter.

Figure 12:
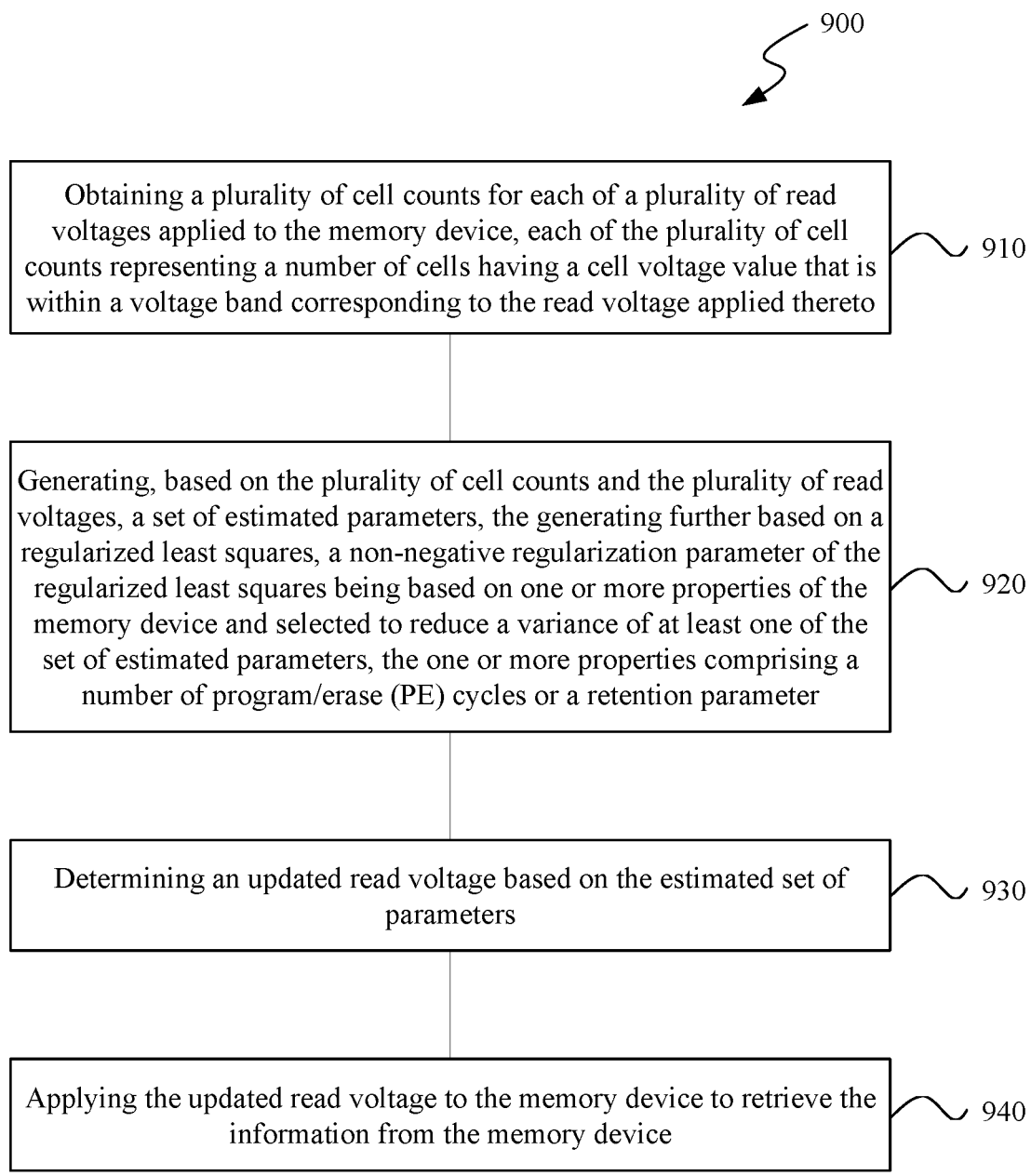
FIG. 12 illustrates a flowchart of yet another method for improving reliability of retrieving information from a memory device.

FIG. 12 is a flowchart illustrating yet another exemplary method for reliably reading information in a memory device. The method 1200 includes, at operation 1210, obtaining a plurality of cell counts for each of a plurality of read voltages applied to the memory device, each of the plurality of cell counts representing a number of cells having a cell voltage value that is within a voltage band corresponding to the read voltage applied thereto.

The method 1200 includes, at operation 1220, generating, based on the plurality of cell counts and the plurality of read voltages, a set of estimated parameters, the generating further based on a regularized least squares, a non-negative regularization parameter of the regularized least squares being based on one or more properties of the memory device and selected to reduce a variance of at least one of the set of estimated parameters, the one or more properties comprising a number of program/erase (PE) cycles or a retention parameter.

The method 1200 includes, at operation 1230, determining an updated read voltage based on the estimated set of parameters.

The method 1200 includes, at operation 1240, applying the updated read voltage to the memory device to retrieve the information from the memory device.

Figure 13:
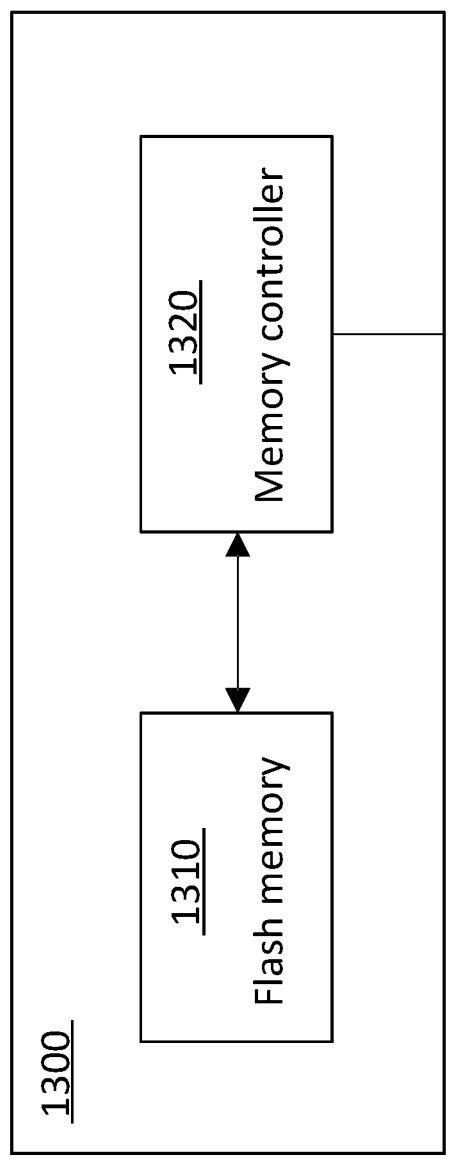
FIG. 13 is a block diagram illustrating an exemplary data storage device that may implement embodiments of the presently disclosed technology.

FIG. 13 is a block diagram illustrating a data storage device according to another example embodiment of inventive concepts. Referring to FIG. 13, a data storage device 1300 may include a flash memory 1310 and a memory controller 1320. The memory controller 1320 may control the flash memory 1310 in response to control signals input from the outside of the data storage device 1300. In the data storage device 1300, the flash memory 1310 may be configured the same or substantially the same as a nonvolatile memory device. That is, the flash memory 1310 may read data from selected memory cells using different read voltages to output it to the memory controller 1320.

The memory controller 1320 may execute the regression computations (e.g., LS or RLS) for deciding an optimal read level of the selected memory cells based on data from the flash memory 1310. The regression computations may enable a higher reliability read level to be decided through reduced and/or minimum read operations.

The data storage device 1300 may be a memory card device, an SSD device, a multimedia card device, an SD card, a memory stick device, a HDD device, a hybrid drive device, or an USB flash device. For example, the data storage device 1300 may be a card which satisfies the standard for user devices such as a digital camera, a personal computer, and so on.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving performance of a memory device, comprising:
   obtaining a plurality of cell counts for each of a plurality of read voltages applied to the memory device, each of the plurality of cell counts representing a number of cells having a cell voltage value that is within a voltage band corresponding to the read voltage applied thereto;
   generating, based on (i) the plurality of cell counts, (ii) the plurality of read voltages and (iii) a design parameter, a set of estimated parameters, the design parameter being based on one or more properties of the memory device and selected to reduce a variance of at least one parameter of the set of estimated parameters;
   determining an updated read voltage based on the estimated set of parameters; and applying the updated read voltage to the memory device to retrieve the information from the memory device, wherein the plurality of cell counts comprises N cell counts, wherein the set of estimated parameters comprises M estimated parameters, wherein N and M are positive integers, and wherein N is greater than (M+1).

2. The method of claim 1, wherein the generating is based on a regularized least squares, and wherein the design parameter is a non-negative regularization parameter.

3. The method of claim 2, wherein the plurality of cell counts is denoted and the plurality of read voltages is denoted $(x_0, x_1, x_{N-1})$, wherein the set of parameters is denoted $(\alpha_0, \alpha_1, \ldots, \alpha_{M-1})$, wherein the non-negative regularization parameter is denoted $\lambda$, wherein the estimated set of parameters $\alpha$ is given by $\alpha=(X^TX+\lambda I)^{-1}X^T y$, wherein $\alpha=[\alpha_0, \alpha_1, \ldots, \alpha_{M-1}]^T$ and $y=[y_0, y_1, \ldots, y_{N-1}]^T$, wherein $$X = \begin{bmatrix} 1 & x_0 & x_0^2 & \cdots & x_0^{M-1} \\ \vdots & \vdots & \vdots & \ddots & \vdots \\ 1 & x_{N-1} & x_{N-1}^2 & \cdots & x_{N-1}^{M-1} \end{bmatrix},$$

wherein I is an M×M identity matrix and T denotes a transpose operation, and wherein N=3, M=2 and the updated read voltage is given by $-\alpha_1/(2\alpha_2)$.

4. The method of claim 3, wherein a first of the plurality of read voltages ($x_0$) is greater than a first read voltage of a first state and less than a second read voltage of a second state, and wherein the method further comprises:

comparing a first of the plurality of cell counts ($y_0$) to an ideal cell count.

5. The method of claim 4, further comprising:

determining that $y_0$ is greater than the ideal cell count; and setting $x_i=x_0-i\Delta$ for $i=1, \ldots, N-1$, wherein $\Delta$ is a predetermined parameter.

6. The method of claim 4, further comprising:

determining that $y_0$ is less than the ideal cell count; and setting $x_i=x_0+i\Delta$ for $i=1, \ldots, N-1$, wherein $\Delta$ is a predetermined parameter.

7. The method of claim 1, wherein the generating excludes a matrix inversion operation and is based on an iterative computation and a stopping criterion.

8. The method of claim 1, wherein the one or more properties of the memory device comprise a number of program/erase (PE) cycles or a retention parameter.

9. A method for improving reliability of retrieving information from a memory device comprising a plurality of cells, the method comprising:

obtaining a plurality of cell counts for each of a plurality of read voltages applied to the memory device, each of the plurality of cell counts representing a number of cells having a cell voltage value that is within a voltage band corresponding to the read voltage applied thereto;

generating, based on the plurality of cell counts and the plurality of read voltages, a set of estimated parameters, the generating further based on a regularized least squares, wherein a non-negative regularization parameter of the regularized least squares is based on one or more properties of the memory device and is selected to reduce a variance of at least one of the set of estimated parameters, the one or more properties comprising a number of program/erase (PE) cycles or a retention parameter;

determining an updated read voltage based on the estimated set of parameters; and applying the updated read voltage to the memory device to retrieve the information from the memory device, wherein the plurality of cell counts comprises N cell counts, wherein the set of estimated parameters comprises M estimated parameters, wherein N and M are positive integers, and wherein N is greater than (M+1).

10. A system for improving performance of a block of a memory device, comprising:

a processor and a memory including instructions stored thereupon, wherein the instructions upon execution by the processor cause the processor to:

obtain a plurality of cell counts for each of a plurality of read voltages applied to the memory device, each of the plurality of cell counts representing a number of cells having a cell voltage value that is within a voltage band corresponding to the read voltage applied thereto;

generate, based on (i) the plurality of cell counts, (ii) the plurality of read voltages and (iii) a design parameter, a set of estimated parameters, the design parameter being based on one or more properties of the memory device and selected to reduce a variance of at least one parameter of the set of estimated parameters;

determine an updated read voltage based on the estimated set of parameters; and apply the updated read voltage to the memory device to retrieve the information from the memory device, wherein the plurality of cell counts comprises N cell counts, wherein the set of estimated parameters comprises M estimated parameters, wherein N and M are positive integers, and wherein N is greater than (M+1).

11. The system of claim 10, wherein the generating is based on a regularized least squares, and wherein the design parameter is a non-negative regularization parameter.

12. The system of claim 11, wherein the plurality of cell counts is denoted $(y_0, y_1, \ldots, y_{N-1})$ and the plurality of read voltages is denoted $(x_0, x_1, x_{N-1})$, wherein the set of parameters is denoted $(\alpha_0, \alpha_1, \ldots, \alpha_{M-1})$, wherein the non-negative regularization parameter is denoted $\lambda$, wherein the estimated set of parameters $\alpha$ is given by $\alpha=(X^TX+\lambda I)^{-1}X^T y$, wherein $\alpha=[\alpha_0, \alpha_1, \ldots, \alpha_M]^T$ and $y=[y_0, y_1, \ldots, y_{N-1}]^T$, wherein $$X = \begin{bmatrix} 1 & x_0 & x_0^2 & \cdots & x_0^{M-1} \\ \vdots & \vdots & \vdots & \ddots & \vdots \\ 1 & x_{N-1} & x_{N-1}^2 & \cdots & x_{N-1}^{M-1} \end{bmatrix},$$

wherein I is an M×M identity matrix and T denotes a transpose operation, and wherein N=3, M=2 and the updated read voltage is given by $-\alpha_1/(2\alpha_2)$.

13. The system of claim 12, wherein a first of the plurality of read voltages ($x_0$) is greater than a first read voltage of a first state and less than a second read voltage of a second state, and wherein the method further comprises:

comparing a first of the plurality of cell counts ($y_0$) to an ideal cell count.

14. The system of claim 13, further comprising:

determining that $y_0$ is greater than the ideal cell count; and setting $x_i=x_0-i\Delta$ for $i=1, \ldots, N-1$, wherein $\Delta$ is a predetermined parameter.

15. The system of claim 13, further comprising:
determining that $y_0$ is less than the ideal cell count; and
setting $x_i = x_0 + i\Delta$ for $i=1, \ldots, N-1$, wherein $\Delta$ is a predetermined parameter.

16. The system of claim 10, wherein the one or more properties of the memory device comprise a number of program/erase (PE) cycles or a retention parameter.

17. A non-transitory computer-readable storage medium having instructions stored thereupon for improving performance of a block of a memory device, comprising:
instructions for obtaining a plurality of cell counts for each of a plurality of read voltages applied to the memory device, each of the plurality of cell counts representing a number of cells having a cell voltage value that is within a voltage band corresponding to the read voltage applied thereto;
instructions for generating, based on (i) the plurality of cell counts, (ii) the plurality of read voltages and (iii) a design parameter, a set of estimated parameters, the design parameter being based on one or more properties of the memory device and selected to reduce a variance of at least one parameter of the set of estimated parameters;
instructions for determining an updated read voltage based on the estimated set of parameters; and
instructions for applying the updated read voltage to the memory device to retrieve the information from the memory device,
wherein the plurality of cell counts comprises N cell counts, wherein the set of estimated parameters comprises M estimated parameters, wherein N and M are positive integers, and wherein N is greater than (M+1).

18. The storage medium of claim 17, wherein the instructions for generating are based on a regularized least squares, and wherein the design parameter is a non-negative regularization parameter.

19. The storage medium of claim 17, wherein the instructions for generating exclude instructions for performing a matrix inversion operation and are based on an iterative computation and a stopping criterion.

20. The storage medium of claim 17, wherein the one or more properties of the memory device comprise a number of program/erase (PE) cycles or a retention parameter.

* * * * *